United States Patent [19]

Akagiri

[11] 4,337,445
[45] Jun. 29, 1982

[54] COMPANDER CIRCUIT WHICH PRODUCES VARIABLE PRE-EMPHASIS AND DE-EMPHASIS

[75] Inventor: Kenzo Akagiri, Yokohama, Japan

[73] Assignee: Sony Corporation, Tokyo, Japan

[21] Appl. No.: 226,822

[22] Filed: Jan. 21, 1981

[51] Int. Cl.³ .............................................. H04B 1/64
[52] U.S. Cl. ...................................... 333/14; 179/1 P
[58] Field of Search ........................... 333/14; 455/72; 179/1 P

[56] References Cited

U.S. PATENT DOCUMENTS

| | | | |
|---|---|---|---|
| 3,873,945 | 3/1975 | Muraoka | 333/14 |
| 4,035,739 | 7/1977 | Dickopp et al. | 333/14 X |
| 4,145,664 | 3/1979 | Takaoka et al. | 333/14 X |
| 4,215,431 | 7/1980 | Nady | 333/14 X |

*Primary Examiner*—Paul L. Gensler
*Attorney, Agent, or Firm*—Alvin Sinderbrand; Lewis H. Eslinger

[57] ABSTRACT

A noise reduction circuit used for signal expansion in a noise-reducing decoder for a signal reproducer, and/or for level-compression in a noise-reducing encoder for a signal recorder, includes a first signal path connected to receive a subtraction signal and including a variable gain amplifier for amplifying the subtraction signal with controllable gain, and a low pass filter for providing substantial de-emphasis of the high frequency components of the amplified subtraction signal relative to the low frequency components thereof to produce a noise-reduced output signal; a second feedback signal path connected to receive the output signal from the low pass filter and including a second low pass filter for providing minor de-emphasis of the high frequency components relative to the low frequency components of the output signal; a subtracting circuit for subtracting the output of the second low pass filter from an input information signal; and a gain control circuit for varying the gain of the variable gain amplifier in accordance with the level of the input information signal so that the gain increases for increasing signal levels of the input information signal.

22 Claims, 8 Drawing Figures

COMPANDER CIRCUIT WHICH PRODUCES VARIABLE PRE-EMPHASIS AND DE-EMPHASIS

BACKGROUND OF THE INVENTION

1. Field of the Invention

This invention relates generally to information signal recording and reproducing apparatus and, more particularly, is directed to a noise reduction circuit for reducing noise generally accompanying a reproduced information signal in an information signal recording and reproducing apparatus.

2. Description of the Prior Art

Noise reduction circuits for reducing noise and distortion which accompany a reproduced information signal are well-known in the art. Such noise reduction circuits are designed to increase the dynamic range of the signal that can be recorded and reproduced from a recording medium such as a magnetic tape. In a typical noise reduction circuit, an encoder is provided for those signals which are to be recorded, and a complementary decoder is provided for those signals which are reproduced. The encoder generally includes a level compression circuit and a high frequency pre-emphasis circuit, wherein higher frequency components of an information signal to be recorded are emphasized with the emphasis level being inversely related to the information signal level. The decoder generally includes a level expansion circuit and a high frequency de-emphasis circuit to perform a complementary operation on the information signals which are reproduced.

For example, in the Dolby ® noise reduction system, a low level input signal is amplified with a substantially constant gain until that input signal reaches a predetermined level. Thereafter, the amplification of that input signal is reduced until yet another, higher level is reached, whereupon amplification with substantially constant gain is carried out once again. In addition to such amplification of the input signal prior to recording, an emphasis circuit is used in order to pre-emphasize the high frequency components of the input signal. This operation generally is referred to as signal compression. After the input signal has been suitably compressed, it is recorded. A complementary siganl expansion process is carried out when the aforementioned signal is reproduced, that is, the pre-emphasized high frequency components are de-emphasized, and the de-emphasized signal is amplified with a gain less than unity. This gain is substantially constant over a predetermined range of relatively low signal levels, and when the reproduced signal exceeds a predetermined level, the gain is increased until a still higher level is reached.

The aforementioned Dolby noise reduction system is of a relatively simple construction and has been used extensively in home entertainment systems, such as magnetic tape recorders and/or reproducers and the like. However, although the Dolby system results in some improvement in the dynamic range of the tape recorder and/or reproducer, this improvement generally is limited to be of the order of about 10 dB; and this improvement is apparent primarily in the frequency region which exceeds 1 KHz. Furthermore, the aforementioned changes in the gain of the level compression and level expansion amplifiers are non-linear, and because of this non-linearity in the gains, level matching between the encoding and decoding processes often is difficult. Thus, some distortion may be apparent for those signals having intermediate signal levels.

Another noise reduction system is the so-called DBX ® system, which is described in U.S. Pat. No. 3,789,143. One advantage of the DBX system over the aforementioned Dolby system is that the gains of the amplifiers which carry out the signal compression and signal expansion operations, that is, the signal compression and signal expansion ratios, are substantially constant, regardless of the signal level of the input information signal. For example, prior to recording the information signal on a magnetic tape or the like, the input information signal is compressed with a constant compression ratio k. When the compression signal is subsequently reproduced, the reproduced signal is expanded with a constant ratio 1/k, that is, with an expansion ratio which is the reciprocal of the compression ratio. Since constant compression and expansion ratios are used throughout the entire signal level range, the non-linearity found in the Dolby system is avoided and level matching between recorded and reproduced signals is easily attained. Moreover, in the DBX system, the apparent improvement in the dynamic range of the tape recorder and/or reproducer is of the order of about 40 dB and desirable noise reduction is achieved over substantially the entire audio frequency range of 20 Hz to 20 KHz.

However, the particular compression and expansion characteristics of the aforementioned noise reduction systems generally are obtained primarily for constant input signal levels, that is, signal levels which do not undergo abrupt transients. Stated otherwise, the advantages attained by these noise reduction systems are a function primarily of the static characteristics thereof. However, difficulties are presented in the dynamic transient characteristics of such systems. For example, if an information signal to be recorded exhibits a relatively low signal level, the gain, or compression ratio, of the encoder amplifier may be relatively high. Now, if this information signal undergoes an abrupt increase in its signal level, that is, it undergoes a large positive transient, the gain of the amplifier, or compression ratio, will not be reduced as rapidly as the rate at which the signal level increases. Hence, although the gain, or compression ratio, should be reduced when processing the high level information signal, in actuality it remains at its prior high level. Consequently, the strong transient is amplified with relatively large gain, thereby resulting in a compressed signal that exhibits "overshoot", that is, the level of the compressed signal is far too large. This high level signal, when recorded, results in saturation of the magnetic medium, thereby causing distortion in the signal which is recorded and in the information which ultimately is reproduced therefrom.

Another disadvantage of the aforementioned noise reduction systems is that they may be subject to so-called noise modulation. With noise modulation, noise components are varied as a function of input signal level variations. Such changes in the noise components, or noise modulation, is highly perceptible and is quite distracting when it accompanies a reproduced audio signal. This phenomenon is pronounced when the frequency components of the input signal are noticeably different from the noise frequency component. For example, if the information signal is an audio signal representing the sound of a piano, noise modulation is heard separately and distinctly, and is not masked even if the volume level of the information signal is increased.

One proposal for reducing noise modulation in a noise reduction circuit is described in U.S. Pat. No. 4,162,462. In this proposal, the high frequency components of the information signal are pre-emphasized prior to recording when the information signal exhibits low and medium signal levels, and relatively little pre-emphasis is provided when the information signal exhibits higher levels. When the information signal processed in the foregoing manner is reproduced, the high frequency components are subjected to relatively high de-emphasis when the reproduced signal exhibits low and medium signal levels, and these high frequency components are subjected to relatively low de-emphasis when the reproduced signal is at a higher level. Although this proposal reduces the undesired effects of noise modulation, saturation of the magnetic record medium due to overshoot in the compressed signal nevertheless is present.

In order to overcome the aforenoted disadvantage presented by overshoot, it also has been proposed to increase the speed of response of the level compression circuitry. However, if the response speed is increased, an improvement in eliminating overshoot is accompanied by deterioration in the noise modulation characteristic. Another proposal in preventing overshoot is described in copending Application Ser. No. 06/151/154, filed May 19, 1980. As will be apparent from the ensuing description, the present invention is an improvement over the noise reduction circuit described in this copending application.

Another proposal of a noise reduction circuit which minimizes overshoot contemplates the use of a plurality of substantially similar noise reduction circuits connected in parallel. Each noise reduction circuit is intended to operate over a selected portion of the frequency spectrum of the input information signal. The outputs of these individual noise reduction circuits are combined, or mixed, resulting in an overall level compressed information signal suitable for recording. However, the use of a plurality of parallel connected noise reduction circuits is relatively complex and expensive. For example, if n such noise reduction circuits are used, the overall cost of the noise reduction system is n times the cost of a noise reduction system in which only a single noise reduction circuit is used.

OBJECTS AND SUMMARY OF THE INVENTION

Accordingly, it is a principle object of this invention to provide an improved circuit for noise reduction that avoids the above-described difficulties encountered with the prior art.

More particularly, it is an object of this invention to provide a circuit for noise reduction that can be used in an information signal recording and/or reproducing system.

It is another object of this invention to provide a circuit for noise reduction that can be used in an encoder to level compress an information signal prior to the recording thereof, and also can be used in a decoder to level expand the reproduced signal, thereby expanding the apparent dynamic range of the recording and reproducing system by a factor of the order of about 20 to 30 dB.

It is still another object of this invention to provide a circuit for noise reduction which produces variable pre-emphasis and de-emphasis without any external manual adjustment thereof.

It is yet another object of this invention to provide a level expansion circuit for noise reduction, which circuit can be used with a coring circuit without adversely affecting circuit operation, thereby preventing transient saturation of the magnetic recording medium due to overshoot.

It is a further object of this invention to provide a level compression circuit the transfer characteristic of which is more frequency-sensitive for low level input signals than for high level input signals, thereby providing greater pre-emphasis for input signals having relatively low levels.

It is a still further object of this invention to provide an improved level expansion circuit the transfer characteristic of which is more frequency-sensitive for low level input signals than for high level input signals, such that greater de-emphasis is obtained for relatively low level signals which are reproduced from a record medium.

It is a yet further object of this invention to provide an improved compression/expansion circuit which can be switchably connected so as to provide a level compression function when used with a signal recorder and to provide a level expansion function when used with a signal reproducer.

It is another object of this invention to provide a circuit for noise reduction that is simple in construction and inexpensive.

In accordance with an aspect of this invention, a circuit for noise reduction includes a first signal path including variable gain amplifier means supplied with a subtraction signal for amplifying the subtraction signal with controllable gain, and means for providing substantial de-emphasis of the high frequency components of the amplified subtraction signal from the variable gain amplifier means relative to the low frequency components thereof to produce an output signal; a second signal path for providing, at most, relatively minor de-emphasis of the high frequency components of the output signal relative to the low frequency components thereof; subtracting means for subtracting the output of the second signal path from an input information signal and for producing the subtraction signal in response thereto; and means for controlling the gain of the variable gain amplifier means to exhibit higher gain when the signal level of the input information signal is relatively high and to exhibit lower gain when said signal level is relatively low.

The above, and other, objects, features and advantages of the present invention will become readily apparent from the ensuing detailed description of the illustrative embodiments of the invention which is to be read in connection with the accompanying drawings.

DETAILED DESCRIPTION OF THE PREFERRED EMBODIMENTS

Figure 1:
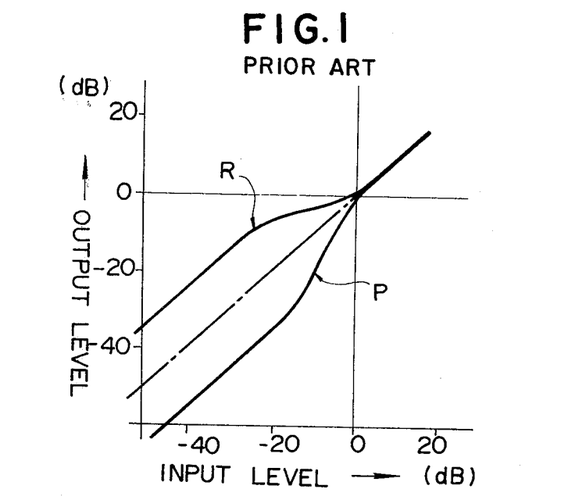
FIGS. 1 and 2 are graphical representations of the compression/expansion characteristics of two prior art noise reduction circuits.

Referring to the drawings in detail, and initially to FIG. 1 thereof, there is shown a graphical representation of the compression/expansion characteristic of the aforementioned Dolby noise reduction system in which the input and output signal levels are in units of decibels. Curve R in FIG. 1 represents the level-compression, input-output characteristic and curve P represents the corresponding level-expansion, input-output characteristic for the Dolby noise reduction system. It is seen that, for input signals having a relatively low level, substantially uniform gain greater than unity is provided until an intermediate level is reached, for example, between −30 dB and 0 dB, whereupon the linearity of the level-compression, input-output characteristic no longer holds true. It should be appreciated that it is this non-linear feature which makes level matching between the decoding and encoding processes difficult, as previously discussed. The dot-dash curve in FIG. 1 represents the so-called "flat bass" in which input and output signal levels are constant both for level compression and level expansion.

Figure 2:
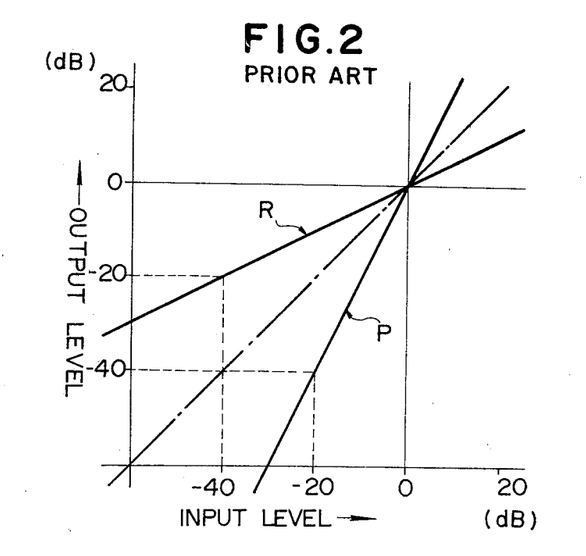

FIG. 2 is a graphical representation of the level-compression, input-output characteristic R and the level-expansion, input-output characteristic P of the aforementioned DBX noise reduction system. It should be appreciated that, in this system, the compression and expansion ratios are substantially constant throughout the entire input signal level range. Here too, the dot-dash curve represents the "flat bass" response. However, as previously mentioned, the Dolby and DBX systems suffer from disadvantages in their dynamic transient characteristics which are overcome by the present invention.

Figure 3:
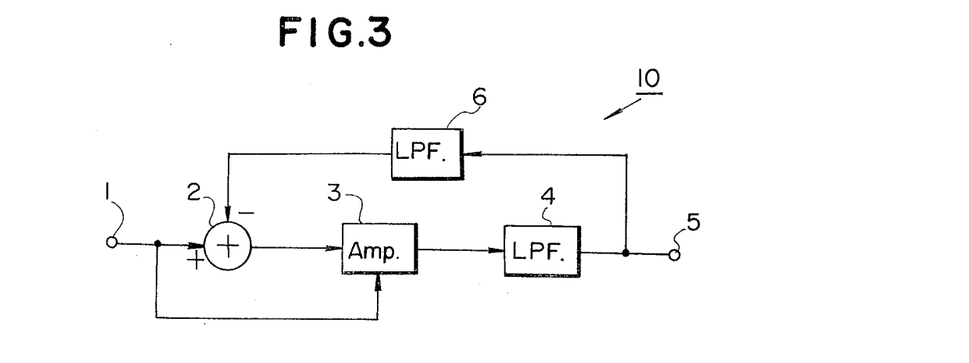
FIG. 3 is a block diagram of a decoder circuit according to a basic embodiment of the present invention.

Referring now to FIG. 3, there is shown a noise reduction circuit 10 according to a basic embodiment of this invention for reducing noise in a reproduced information signal. As shown therein, noise reduction circuit 10 includes an input terminal 1 supplied with a reproduced information signal, for example, an audio signal reproduced from a magnetic tape and, which in turn, supplies the reproduced information signal to an adding input of a subtracting circuit 2. A first signal path includes a variable gain amplifier 3 supplied with the output signal from subtracting circuit 2 and having its gain controlled by the reproduced information signal from input terminal 1 after being rectified and smoothed (not shown in FIG. 3). The output of variable gain amplifier 3 is coupled to a low pass filter 4, also in the first siganl path, in which high frequency components of the signal supplied thereto are de-emphasized. The resultant signal from low pass filter 4 is then supplied to an output terminal 5 and to a subtracting input of subtracting circuit 2 through a second signal path which is shown to include a low pass filter 6.

Variable gain amplifier 3 is adapted to amplify the output signal from subtracting circuit 2 by a variable gain. In particular, the gain G of variable gain amplifier 3 is determined by a gain control voltage $V_c$ which is derived from the information signal at input terminal 1 after being rectified and smoothed, as previously mentioned. The gain G of variable gain amplifier 3 is designed to increase with increases in the gain control voltage $V_c$, for example, in accordance with the relationship $G = K \cdot V_c$ or $G = e^{KV_c}$, where K is a constant. In this manner, the gain of amplifier 3 is directly related to the level of the information signal from input terminal 1 such that the gain thereof is relatively high when the level of the information signal from input terminal 1 is relatively high and, conversely, the gain thereof is relatively low when the level of the information signal from input terminal 1 is relatively low. Thus, variable gain amplifier 3 attains level expansion of the signals supplied thereto.

low pass filter 4, which is also included in the first signal path, is adapted to provide substantial de-emphasis of the high frequency components included in the output signal from variable gain amplifier 3. As stated otherwise, low pass filter 4 effectively provides a substantial pre-emphasis to the low frequency components of the signal supplied thereto with respect to the high frequency components. For example, the high frequency components are preferably de-emphasized relative to the low frequency components by a factor of the order of about 20 dB.

Low pass filter 6 which constitutes the second signal path provides relatively minor de-emphasis of the high frequency components of the output signal from low pass filter 4 relative to the low frequency components. For example, the high frequency components may be reduced, or attenuated, relative to the low frequency components by a factor of the order of about 6 dB. By connecting low pass filter 6 to the output of low pass filter 4, it has been found that a smoother overall de-emphasis characteristic can be obtained over that of the aforementioned copending Application Ser. No. 06/151,154 and the circuitry can be simplified. Alternatively, low pass filter 6 may function merely as an attenuator so as to provide uniform de-emphasis for the entire frequency range, that is, for both high and low frequency components. However, low pass filter 6 preferably provides a minor de-emphasis characteristic to the high frequency components of the signal supplied thereto. In such case, since the output of low pass filter 6 is subtracted from the information signal from input terminal 1 in subtracting circuit 2, this latter circuit effectively provides a minor pre-emphasis characteristic to the high frequency components of the information signal.

It should therefore be appreciated that the input-output characteristic of noise reduction circuit 10 depends on which of the first and second signal paths is dominant. More particularly, it is to be remembered that the input-output characteristic of subtracting circuit 2 results in a slight or minor pre-emphasis of the high frequency components of the signal supplied to variable gain amplifier 3. For example, the level of the high frequency components may be only a few dB greater than the level of the low frequency components. When the level of the information signal supplied to input terminal 1 is of a low level, the gain of variable gain amplifier 3 is relatively low. This, of course, does not result in much change between the levels of the high and low frequency components so that the high frequency components of the amplified signal supplied to low pass filter 4 have a level only a few dB greater than that of the low frequency components. Since low pass filter 4 provides a substantial de-emphasis of the high frequency components of the signal supplied to it, for example, of the order of about 20 dB, as previously discussed, the output signal from low pass filter 4, which is supplied to output terminal 5, has its high frequency components substantially de-emphasized relative to the low frequency components thereof. In other words, the first signal path comprised of variable gain amplifier 3 and low pass filter 4 provides a dominant action and the affect of the second signal path constituted by low pass filter 6 is minimal on the signal supplied to output terminal 5.

This substantial de-emphasis of the high frequency components of the signal supplied to output terminal 5 decreases with increasing signal level of the information signal at input terminal 1. Thus, when the level of the information signal supplied to input terminal 1 is high, the gain of variable gain amplifier 3 is also high. Since the signal supplied to variable gain amplifier 3 has its high frequency components slightly pre-emphasized relative to its low frequency components, amplification by variable gain amplifier 3 results in a substantial pre-emphasis of the high frequency components relative to the low frequency components, for example, greater than 20 dB. In other words, variable gain amplifier 3 provides an expansion characteristic to the signal supplied thereto. Thus, when low pass filter 4 provides a substantial high frequency de-emphasis characteristic to the signal supplied thereto, for example, of the order of about 20 dB, the resultant signal supplied to output terminal 5 has a slight or minor high frequency pre-emphasis characteristic. It should therefore be appreciated that, for high level information signals, the second signal path plays an important or dominant role in determining the output characteristic of the signal supplied to output terminal 5.

Figure 4:
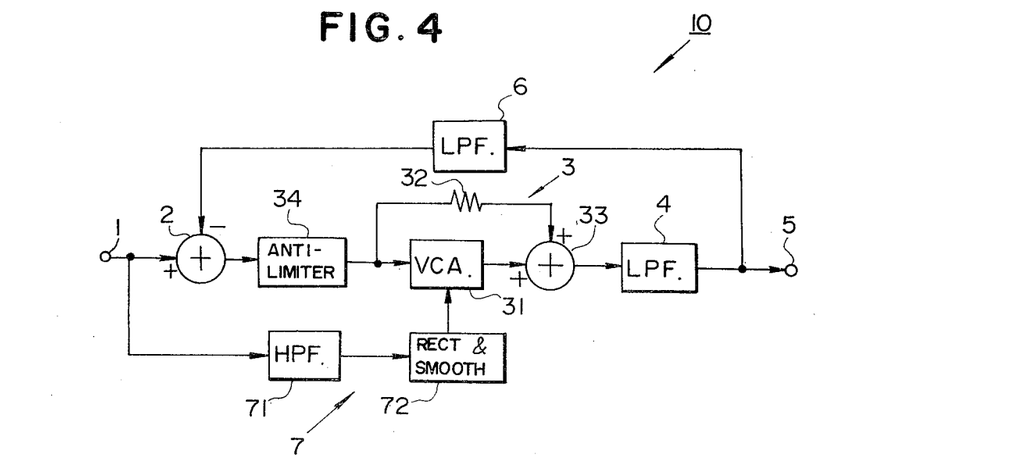
FIG. 4 is a block diagram of a more detailed, practical embodiment of the decoder circuit of FIG. 3.

Referring now to FIG. 4, there is shown a practical embodiment of noise reduction circuit 10, with elements corresponding to those described above with reference to the circuit of FIG. 3 being identified by the same reference numerals. As shown therein, variable gain amplifier 3 is comprised of a voltage controlled amplifier (VCA) 31 and a summing circuit 33 supplied with the output from voltage controlled amplifier 31 at one input thereof and supplied with the input signal to voltage controlled amplifier 31 at another input thereof through a resistor 32. The combination of VCA 31 and summing circuit 33 provides a gain to the signal supplied thereto which is dependent on the level of the information signal at input terminal 1. In other words, low level signals supplied thereto are subjected to a low gain and high level signals supplied thereto are subjected to a high gain.

Noise reduction circuit 10 in FIG. 4 is further provided with a gain control circuit 7 for controlling the gain of VCA 31 and is comprised of a weighting circuit 71 coupled to input terminal 1 and a rectifier and smoothing circuit 72 for rectifying and smoothing the output of weighting circuit 71 and supplying the same to VCA 32 as a gain control voltage therefor. Weighting circuit 71 exhibits a high pass filter characteristic which, in one example, may be directly opposite to the high frequency de-emphasis characteristic of low pass filter 4. In other words, weighting circuit 71, in such case, provides a pre-emphasis characteristic of the high frequency components of the signal supplied thereto relative to the low frequency components. Alternatively, it may be possible to connect gain control circuit 7 to the input of VCA 31 rather than input terminal 1, although in such case, changes may have to be made with respect to weighting circuit 71.

Further, noise reduction circuit 10 in FIG. 4 includes a coring or anit-limiting circuit 34 between subtracting circuit 2 and VCA 31. When the level of the signal supplied to anti-limiting circuit 34 is of a low level, anti-limiting circuit 34 virtually has no effect on the signal. However, when such signal level is high, that is, exceeds a predetermined level, the signal supplied thereto is expanded, resulting in a further expansion of the signal supplied to variable gain amplifier 3. Anti-limiting circuit 34, as will be discussed hereinafter in greater detail, is provided for use in decoder or noise reduction circuit 10 and in a complementary encoder circuit to prevent, or limit, transient overshoot of the signal to be recorded on the magnetic tape and which results in distortion of the signal due to saturation of the magnetic tape.

As before, low pass filter 4 is adapted to provide substantial de-emphasis to the high frequency components, relative to the low frequency components, included in the signal supplied thereto from summing circuit 33. Also, low pass filter 6, as previously discussed, is adapted to provide relatively minor de-emphasis to the high frequency components of the signal supplied thereto relative to the low frequency components.

Figure 5:
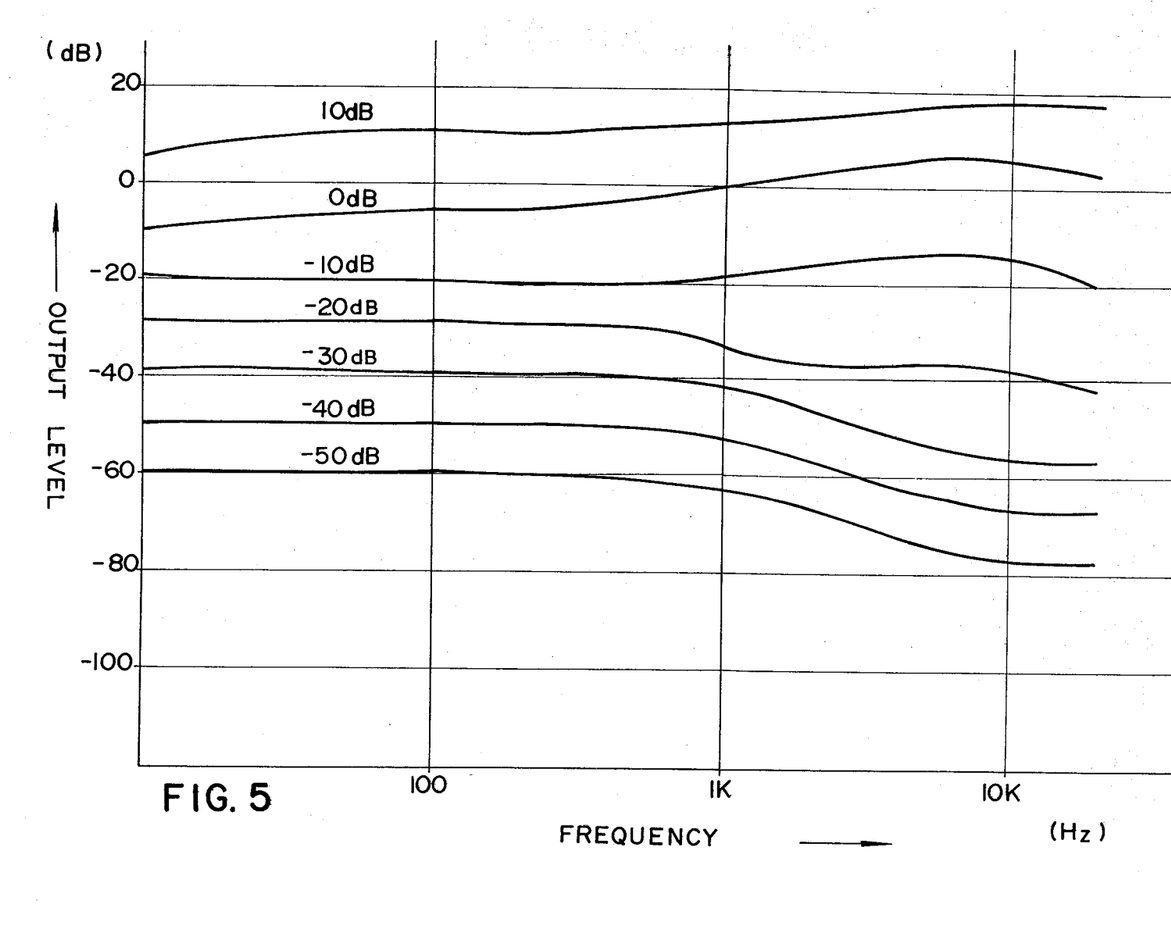
FIG. 5 is a graphical representation of the level-frequency characteristic of the decoder circuit of FIG. 4 for various input levels.

FIG. 5 is a graphical representation of the level expansion characteristics of noise reduction circuit 10 of FIGS. 3 and 4. The abscissa in FIG. 5 represents the frequency of the information signal at input terminal 1 and the ordinate represents the output signal level at output terminal 5 in terms of decibels. Each curve in FIG. 5 represents a particular signal level. It is seen that, when the level of the information signal is relatively low, the high frequency de-emphasis characteristic of the first signal path is dominant in determining the characteristic of the output signal. In order words, for such low level signal, the gain of VCA 31 is also relatively low so that the slightly pre-emphasized high frequency signals supplied thereto remain with their high frequency components slightly pre-emphasized. However, since low pass filter 4 provides a substantial high frequency de-emphasis to the signals supplied thereto, such low level signals have their high frequency components substantially attenuated. This is shown more particularly by the lower three curves in FIG. 5, corresponding to input levels $V_{in}$ of the information signal of $-30$, $-40$ and $-50$ dB, respectively. It should be appreciated that anti-limiting circuit 34 has substantially no effect on low level signals supplied thereto and therefore does not substantially affect the output-frequency characteristic of such signals.

When the level of the information signal supplied to input terminal 1 is high, subtracting circuit 2 supplies a high level signal with its high frequency components slightly pre-emphasized over the low frequency components to anti-limiting circuit 34. As previously discussed, for high level signals, anti-limiting circuit 34 acts as an expansion circuit so as to expand the signal supplied thereto. In other words, the difference in level between the high frequency and low frequency components is further increased. The expanded signal is then supplied to VCA 31. Since the gain of VCA 31 is controlled by control circuit 7 to be high at such time, the expanded signal from anit-limiting circuit 34 is further expanded by variable gain amplifier 3 to provide a greatly expanded signal, the high frequency components of which are at a much greater level than the low frequency components. This greatly emphasized signal is supplied to low pass filter 4 which substantially de-emphasizes the high frequency components. For high input levels $V_{in}$ of the information signal equal to 0 and 10 dB, the expansion by anti-limiting circuit 34 and variable gain amplifier 3 generally results in a signal the high frequency components of which are emphasized with respect to the low frequency components by greater than 20 dB. Since low pass filter 4 substantially de-emphasizes the high frequency components of the signal supplied thereto, but only on the order of about 20 dB, the signal supplied to output terminal 5, as shown in FIG. 5, has its high frequency components slightly pre-emphasized with respect to the low frequency components thereof. The dividing line between pre-emphasis and de-emphasis of the high frequency components of the signal supplied to output terminal 5 is shown in FIG. 5 to correspond to an input signal level $V_{in}$ of $-10$ dB. In other words, for input levels $V_{in}$ less than $-10$ dB, the first signal path, and in particular, low pass filter 4 thereof, has a dominant effect on the signal supplied to output terminal 5. However, for high levels of the information signal, that is, for $V_{in}$ greater than $-10$ dB, the affect of low pass filter 4 is greatly diminished so that the slight pre-emphasis which results from low pass filter 6, and which is greatly amplified or expanded by variable gain amplifier 3, provides a dominant effect on the signal supplied to output terminal 5.

Figure 6:
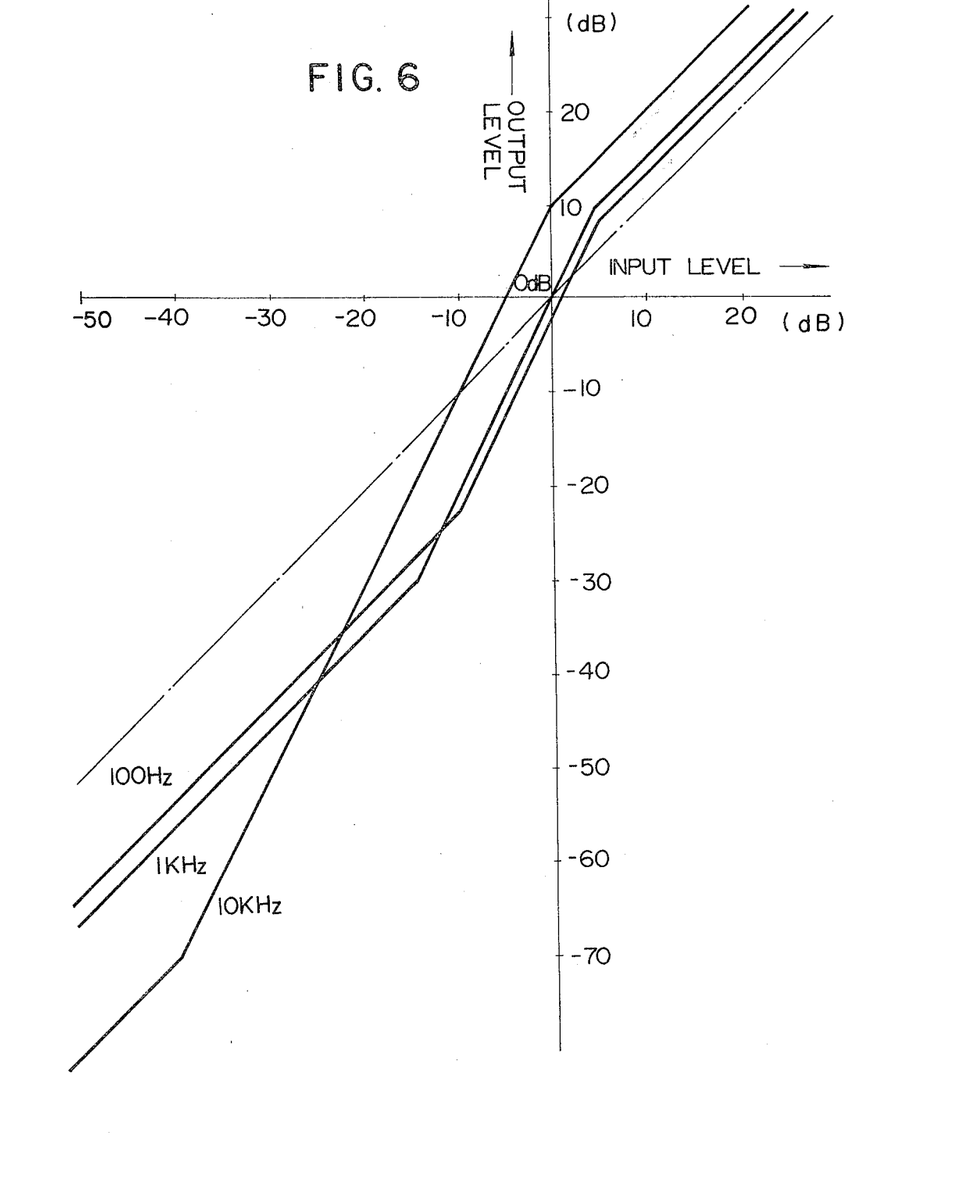
FIG. 6 is a graphical representation of the input-output characteristic of the decoder circuit of FIG. 4 for various frequencies.

The level expansion characteristics of noise reduction circuit 10 for signals of frequencies 100 Hz, 1 KHz and 10 KHz are illustrated by the respective curves shown in FIG. 6. It should be appreciated from this figure that level expansion is attained over a wider range, and by a greater degree, for high frequency components (e.g. 10 KHz) than for low frequency components (e.g. 100 Hz and 1 KHz). The dot-dash line shown in FIG. 6 represents the usual flat bass response.

It will be seen from the foregoing that the noise reduction circuit in accordance with the present invention provides variable de-emphasis, that is, different de-emphasis curves are obtained for different levels of the input signal. Because of this variable de-emphasis, substantially higher de-emphasis is provided over the high frequency range when the input signal level is relatively low for reducing the effects of noise modulation which are more apparent during such time. A substantially flat de-emphasis characteristic, or a slight high freqnency emphasis characteristic, is obtained when the input signal level is relatively high. This is preferred because, if the input signal level is relatively high, it may be recorded on a magnetic medium without the need of any pre-emphasis thereon.

The invention described in the foregoing embodiments is of a relatively simple construction and, is therefore, inexpensive. Nevertheless, this invention permits variable de-emphasis to be obtained, as described above, without requiring any external or manual adjustment. By providing large de-emphasis over a high frequency range when the input signal level is low, the aforementioned phenomenon of noise modulation is substantially reduced and, in many cases, may be effectively eliminated. Furthermore, the present invention readily enables an anti-limiting circuit 34, which as will be hereinafter discussed, can be used as a limiter circuit in a corresponding encoder section to prevent transient saturation of the magnetic recording medium due to overshoot caused by an abrupt, or sudden, increase in signal level which, heretofore, could not be compensated quickly enough.

One embodiment of a circuit wiring diagram for noise reduction circuit 10 in FIG. 4 will now be described with reference to the illustration set out in FIG. 7, in which elements corresponding to those described above with reference to FIG. 4 are identified by the same reference numerals. As shown therein, subtracting circuit 2 is comprised of two adding resistors 21 and 22 and an operational amplifier 24. In particular, one end of resistor 21 is connected to input terminal 1 and the other end thereof is connected to an end of resistor 22. The other end of resistor 22 is connected to the output of operational amplifier 24 which acts as an inverter to invert the output of the second signal path so as to produce the required subtraction signal.

The connection point between resistors 21 and 22 is connected to the inverting input of an operational amplifier 23 which supplies the subtraction signal to the first signal path and, in particular, to the inverting input of an operational amplifier 35. Also included in the first signal path is a negative feedback resistor 36 which is connected between the output and input of amplifier 35.

It should be appreciated by those of ordinary skill in the art that the gain of an amplifier circuit formed of an operational amplifier is a function of the feedback impedance, that is, the impedance connected between the output and input of the operational amplifier, divided by the input impedance, that is, the impedance connected to the input thereof. The gain of the amplifier circuit thus may be adjusted by varying either the feedback impedance or the input impedance. In the embodiment shown in FIG. 7, the feedback impedance is fixed by feedback resistor 36, while the input impedance, which will hereinafter be discussed, is adjustable in response to a control signal supplied thereto so as to vary the gain of variable gain amplifier 3 constituted by operational amplifier 35.

In particular, the input impedance to operational amplifier 35 is controlled by three impedance paths connected in parallel between the output of operational amplifier 23 and the inverting input of operational amplifier 35. The first impedance path is constituted by a resistor 37 having a fixed resistance value; the second impedance path is constituted by a variable resistance element 38; and the third impedance path is constituted by anti-limiting circuit 34 connected in series with a resistor having a fixed resistance value. In particular, variable resistance element 38 has its resistance value changed in accordance with the control signal from control circuit 7. As one example thereof, variable resistance element 38 may be, for example, a photo-responsive element, such as a CdS photo-conductive cell, a photo-resistor, or the like, exhibiting an impedance or resistance that is variable as a function of the intensity of light impingent thereon. For example, the photo-responsive element may be light coupled to a light emitting diode, or other light-emitting source, capable of transmitting light to the photo-responsive element as a function of a control voltage supplied thereto. This control voltage is produced by control circuit 7 comprised of weighting circuit 71 and rectifying and smoothing circuit 72. As the control voltage increases, the intensity of the light emitted by the light-emitting source likewise increases so as to reduce the resistance or impedance of the light-responsive element, thereby increasing the gain of variable gain amplifier 3. Conversely, as the control voltage decreases, the intensity of the light emitted by the light-emitting source likewise decreases so as to increase the impedance of the light-responsive element, thereby decreasing the gain of variable gain amplifier 3.

As an alternative to the aforementioned photo-responsive element, variable resistance element 38 may be comprised of a field effect transistor (FET), bi-polar junction transistor, or the like, the impedance of which is controllable in response to the control voltage supplied thereto by control circuit 7. Thus, as the impedance of the FET or transistor varies, the gain of the variable gain amplifier also varies.

Figure 7:
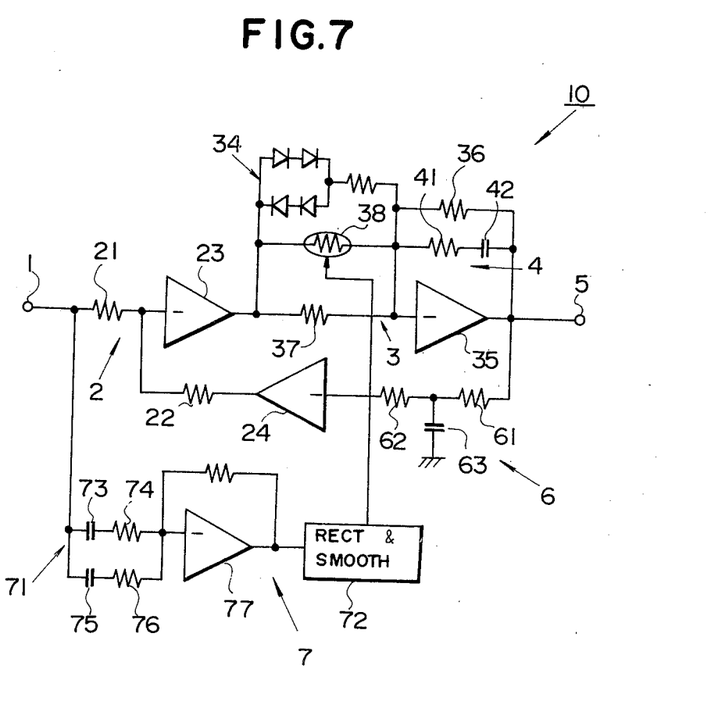
FIG. 7 is a block-circuit wiring diagram illustrating one embodiment of a circuit construction of the decoder circuit of FIG. 4.

In the embodiment shown in FIG. 7, anti-limiting circuit 34 is illustrated as being comprised of a pair of parallel-connected, oppositely-poled diode circuits connected in series with a fixed resistance in the third input impedance path. In this example, each diode circuit is formed of two diodes in series. It should be appreciated that anit-limiter circuit 34 acts as a coring circuit. In other words, if each of the diodes has a cut-in voltage level $V_{be}$ equal to 0.7 volts (for silicon diodes), then the third impedance path conducts only when the level of the input level supplied thereto is greater than 1.4 volts or less than $-1.4$ volts, that is, only for positive or negative high level signals. Thus, when the input signal level is low, the third impedance path is effectively eliminated from the circuit so that the impedance for the signal supplied to operational amplifier 35 is determined by the parallel combination of resistor 37 and variable resistance element 38. However, once the input level exceeds the diode cut-in voltage, the illustrated resistor in the third impedance path is connected in the input impedance circuit and is thus disposed in parallel with resistor 37 and variable resistance element 38, thereby reducing the effective input impedance so as to increase the gain of the amplifier. In other words, anti-limiter circuit 34 acts to expand the input information signal for high levels thereof.

Low pass filter 4 if constructed by connecting a high pass filter between the input and output of operational amplifier 35. In particular, low pass filter 4 is comprised of a resistor 41 and a capcitor 42 connected in a series path across the input and output of operational amplifier 35 in parallel with negative feedback resistor 36.

The output of operational amplifier 35 is coupled to output terminal 5 and is also coupled to the second signal path comprised of low pass filter 6. In particular, low pass filter 6 is formed of a pair of series-connected resistors 61 and 62 connected between the output of operational amplifier 35 and the inverting input of inverting operational amplifier 24, and a capacitor 63 connected between ground and the connection point between resistors 61 and 62. It should therefore be appreciated that the output of operational amplifier 35 supplied to low pass filter 6 is inverted and added to the incoming information signal at the connection point between resistors 21 and 22.

Control circuit 7, which is coupled to input terminal 1 and which is comprised of weighting circuit 71 and rectifying and smoothing circuit 72 produces the aforementioned control voltage which is used to adjust the resistance of variable resistance element 38 and thereby adjust the gain of variable gain amplifier 3. Weighting circuit 71 is comprised of a high pass filter formed by a first series circuit including a capacitor 73 and resistor 74 and a second series circuit connected in parallel with the first series circuit and including a capacitor 75 and resistor 76. The output of these parallel-connected series circuits is connected to an amplifier 77 which, preferably, is an operational amplifier exhibiting negative gain and having a feedback resistor, as illustrated. It will be appreciated that weighting circuit 71 exhibits a high pass filter characteristic which is substantially equal to that of the high pass filter circuit connected between the input and output of operational amplifier 35 and which constitutes low pass filter 4. The output of amplifier 77 is coupled to rectifying and smoothing circuit 72, the latter being comprised of, for example, a diode coupled to a capacitive filter. Rectifying and smoothing circuit 72 produces a DC control signal that is a function of the level of the high frequency components passed by weighting circuit 71.

Thus, as previously discussed, the noise reduction circuit in FIG. 7 is adapted to provide a variable de-emphasis function which provides varying degrees of de-emphasis in accordance with the level of the input signal. In this manner, noise reduction circuit 10 of FIG. 7 provides substantial high frequency de-emphasis for low level input signals to effectively eliminate noise modulation as well as permitting expansion of the dynamic range while preventing overshoot for high level input signals. Thus, the level expansion characteristics illustrated in FIG. 5 are obtained by the circuit illustrated in FIG. 7.

Figure 8:
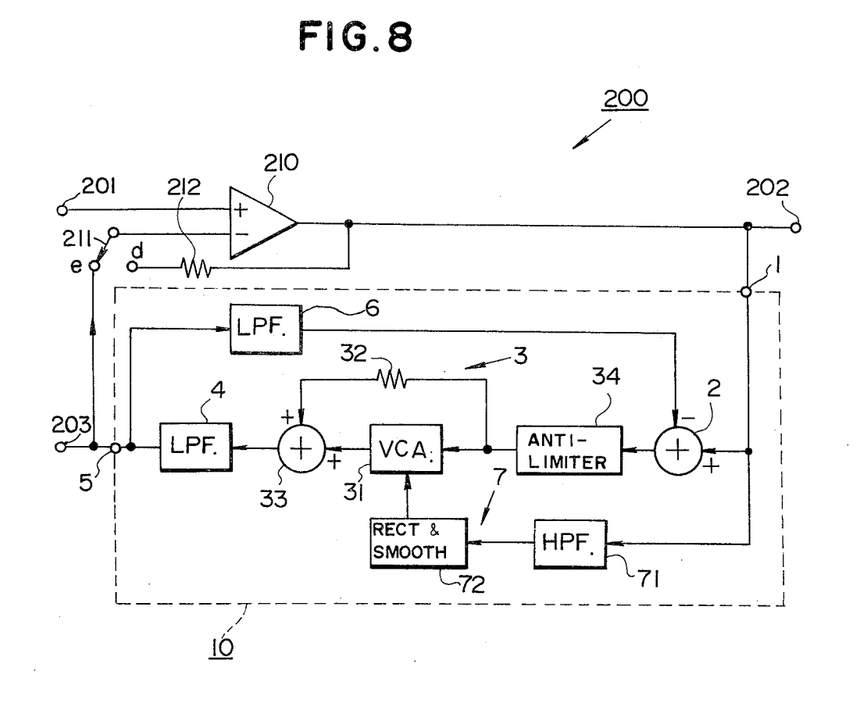
FIG. 8 is a block-circuit wiring diagram showing the use of the decoder circuit of FIG. 4 as an encoder or decoder in a noise reduction system.

In the embodiments of the present invention thus far described, the noise reduction circuit has been used as a level expansion circuit in a decoder for information signals which have been magnetically recorded. A level compression circuit in an encoder should be provided with level compression characteristics which are complementary to the characteristics shown in FIG. 5. In this manner, the noise reduction circiut of FIG. 4 can be used in such an encoder, as illustrated in FIG. 8. More particularly, noise reduction circuit 10 is connected in the negative feedback path of an operational amplifier 210, this operational amplifier having a non-inverting input coupled to an input terminal 201 to receive an input signal to be recorded, and an inverting input coupled to the output terminal 5 of noise reduction circuit 10 of FIG. 4. The output of amplifier 210 is coupled to input terminal 1 of noise reduction circuit 10.

Desirably, noise reduction circuit 10 is selectively disposed for operation either as an encoder or a decoder in a circuit 200. To this effect, amplifier 210 is provided with a switching element 211, schematically illustrated as a mechanical switch, having two switching conditions. When switch 211 engages contact e, noise reduction circuit 10 is connected as a negative feedback circuit from the output to the inverting input of amplifier 210, as described above. When switch 211 is connected to contact d, a feedback resistor 212 is connected between the output and inverting input of amplifier 210, thus establishing the gain of the amplifier, and the output of amplifier 210 is further connected to supply amplified information signals to noise reduction circuit 10. Thus, when switch 211 is connected to contact e, the illustrated circuit 200 functions as an encoder to produce level compressed information signals at output terminal 202. However, when switch 211 is coupled to contact d, circuit 200 functions as a decoder to produce level expanded signals at output terminal 5. As illustrated, output terminal 5 is coupled to another output terminal 203 which, in turn, may be coupled to a magnetic recording transducer.

It is appreciated that, by using noise reduction circuit 10 in two switchable modes, the same circuit can be used as an encoder and as a decoder, thus providing desirable conservation of parts. In typical recording/reproducer apparatus, such as in an audio tape recorder, information signals are not recorded and reproduced concurrently. Thus, rather than providing separate encoding and decoding circuitry, it is advantageous to utilize the same noise reduction circuit 10 for the separately performed encoding and decoding operations. Moreover, by using the same noise reduction circuit in both modes of operation, there is no difficulty in matching the characteristics of the encoder and decoder.

The characteristics of noise reduction circuit 10 have been described in detail hereinabove and, in the interest of brevity, this description is not repeated. It is appreciated, therefore, that when switch 211 engages fixed contact d, circuit 200 operates in substantially the same manner as discussed in detail hereinabove with respect to the embodiment of FIGS. 4 and 7, that is, the input information signal is amplified by amplifier 210 and suitably level-expanded, with variable de-emphasis, by circuit 10.

When switch 211 engages contact e, the transfer characteristics of circuit 10 are used as the negative feedback gain B of circuit 200. If the open loop gain of amplifier 210 is represented as A, then the overall gain, or transfer characteristic, of circuit 200 is equal to $A/(-1+AB)$. This, of course, is the gain of an amplifier having negative feedback. Now, if the product AB is sufficiently large, that is, $AB > 1$, then the gain, or transfer characteristic, of circuit 200, when disposed in its encoding configuration, merely is equal to $1/B$. Thus, when circuit 10 is connected as a negative feedback circuit to amplifier 210, the overall characteristics of circuit 200 are converse, or complementary to, the decoder transfer characteristic B. Hence, it is appreciated that, when circuit 10 is used as an encoder, a level compressed, pre-emphasized signal which is complementary to the decoder characteristic is produced for recording on the record medium.

Having described specific preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims.

What is claimed is:

1. A circuit for noise reduction comprising:
    a first signal path including variable gain amplifier means supplied with a subtraction signal for amplifying the subtraction signal with controllable gain, and means for providing substantial de-emphasis of the high frequency components of the amplified subtraction signal from said variable gain amplifier means relative to the low frequency components thereof to produce an output signal;
    a second signal path for providing, at most, relatively minor de-emphasis of the high frequency components of the output signal relative to the low frequency components thereof;
    subtracting means for subtracting the output of said second signal path from an input information signal and for producing said subtraction signal in response thereto; and
    means for controlling the gain of said variable gain amplifier means to exhibit higher gain when the signal level of the input information signal is relatively high and to exhibit lower gain when said signal level is relatively low.

2. The circuit according to claim 1; wherein said second signal path includes a low pass filter.

3. The circuit according to claim 2; wherein said low pass filter includes first and second resistance elements connected in series between said subtracting means and said variable gain amplifier means, and a capacitive element connected between the connection point of said first and second resistance elements and a reference potential.

4. The circuit according to claim 1; wherein said means for providing substantial de-emphasis includes a low pass filter.

5. The circuit according to claim 1; wherein said variable gain amplifier means includes a voltage-controlled amplifier supplied with said subtraction signal, an impedance path supplied with said subtraction signal, and summing means for adding the outputs of said voltage-controlled amplifier and said impedance path to produce said amplified subtraction signal.

6. The circuit according to claim 1; wherein said variable gain amplifier means includes an amplifier, feedback impedance means for feeding back a portion of the output of said amplifier to the input thereof, and input impedance means for supplying said subtraction signal to said amplifier.

7. The circuit according to claim 6; wherein said input impedance path includes a first impedance element having a fixed impedance and a second variable impedance element connected in parallel with said first impedance element between the input of said amplifier and said subtracting means, the impedance of said second variable impedance element being controlled by said means for controlling.

8. The circuit according to claim 7; wherein said input impedance path includes a series circuit of anti-limiter means and a third impedance element having a fixed impedance, the series circuit being connected in parallel with said first impedance element and said second variable impedance element.

9. The circuit according to claim 8; wherein said anti-limiter means includes a first diode circuit connected in parallel with a second diode circuit and being oppositely-poled.

10. The circuit according to claim 6; wherein said means for providing substantial de-emphasis includes a low pass filter.

11. The circuit according to claim 10; wherein said low pass filter includes a resistive element and a capacitive element connected in series between the input and output of said amplifier.

12. The circuit according to claim 1; wherein said first signal path further includes anti-limiter means connected between the subtracting means and said variable gain amplifier means for expanding the subtraction signal for high levels thereof.

13. The circuit according to claim 1; wherein said means for controlling the gain of said variable gain amplifier means includes weighting circuit means supplied with said information signal for deriving a gain control signal from the high frequency components of said input information signal; and means for applying said gain control signal to said variable gain amplifier means such that the gain of the latter is directly related to the level of said gain control signal.

14. The circuit according to claim 13; wherein said variable gain amplifier means includes a voltage-controlled amplifier; and said means for applying said gain control signal comprises rectifying means for producing a gain control voltage as a function of said gain control signal.

15. The circuit according to claim 13; wherein said weighting circuit means includes a high pass filter.

16. The circuit according to claim 15; wherein the high pass filter has a filtering characteristic substantially opposite to that of said means for providing substantial de-emphasis.

17. The circuit according to claim 15; wherein said high pass filter includes a first series circuit of a first resistive element and a first capacitive element, and a second series circuit connected in parallel with the first series circuit and including a second resistive element and a second capacitive element.

18. A level expansion circuit having a transfer characteristic that is more frequency-sensitive for low level input signals than for high level input signals, such that high frequency components are subjected to greater level-adjustment for low level input signals, comprising:
   a first signal path including variable gain amplifier means for amplifying a subtraction signal supplied thereto, and low pass filter means for emphasizing low frequency components relative to high frequency components of the amplified subtraction signal from said variable gain amplifier means to produce an output signal;
   a second feedback signal path for providing, at most, relatively little emphasis of the low frequency components of said output signal relative to the high frequency components thereof;
   subtracting means for subtracting the output of said second signal path from said input signal and for producing said subtraction signal in response thereto; and
   control means for controlling the gain of said variable gain amplifier means such that said gain increases as the input signal level increases.

19. The circuit according to claim 18; wherein said first signal path includes anti-limiter means connected between said subtracting means and said variable gain amplifier means for expanding the subtraction signal for high levels thereof.

20. The circuit according to claim 18; wherein said control means includes high pass filter means for filtering said input signal, and smoothing means for smoothing said filtered input signal to produce a gain-control signal which is supplied to said variable gain amplifier means for controlling the gain thereof.

21. A level compression circuit having a transfer characteristic that is more frequency-sensitive for low level input signals than for high level input signals, such that high frequency components are subjected to greater gain at low input levels, comprising:
   an amplifier for receiving said input signals and having an output terminal for providing a level-compressed signal; and
   a negative feedback circuit coupled to said output terminal and including:
      a first signal path including variable gain amplifier means for amplifying a subtraction signal supplied thereto, and low pass filter means for emphasizing low frequency components relative to high frequency components of the amplified subtraction signal to produce a feedback signal;
      a second feedback signal path for providing, at most, relatively little emphasis of the low frequency components of siad feedback signal relative to high frequency components thereof;
      subtracting means for subtracting the output of said second signal path from said level-compressed signal; and
      control means for controlling the gain of said variable gain amplifier means such that said gain increases as the level of said level-compressed signal increases.

22. A level compression/expansion circuit for noise reduction, comprising:
   an amplifier for receiving an input signal and having an output terminal at which an output signal is produced;
   a negative feedback circuit coupled to said output terminal and including:
      a first signal path including variable gain amplifier means for amplifying a subtraction signal supplied thereto, and low pass filter means for emphasizing low frequency components relative to high frequency components of the amplified subtraction signal to produce a feedback signal;
      a second feedback signal path for providing, at most, relatively little emphasis of the low frequency components of said feedback signal relative to high frequency components thereof;
      subtracting means for subtracting the output of said second signal path from said output signal; and
      control means for controlling the gain of said variable gain amplifier means such that said gain increases as the level of said output signal increases; and
   switch means having a first condition in which the level compression/expansion circuit functions as a level expansion circuit to produce a level-expanded signal at the output of said low pass filter means, and having a second condition in which the output of said low pass filter means is fed back to said amplifier in a negative feedback relationship such that said level compression/expansion circuit functions as a level compression circuit to produce a level-compressed signal at the output terminal of said amplifier.

* * * * *